United States Patent [19]

Matsuda et al.

[11] Patent Number: 5,198,882
[45] Date of Patent: Mar. 30, 1993

[54] CRIMP-TYPE POWER SEMICONDUCTOR DEVICE

[75] Inventors: Hideo Matsuda, Yokohama; Susumu Iesaka, Tokyo; Takashi Fujiwara, Yokohama; Michiaki Hiyoshi, Yokohama; Hisashi Suzuki, Yokohama, all of Japan

[73] Assignee: Kabushiki Kaisha Toshiba, Kawasaki, Japan

[21] Appl. No.: 589,600

[22] Filed: Sep. 28, 1990

[30] Foreign Application Priority Data

Oct. 2, 1989 [JP] Japan .................. 1-257412

[51] Int. Cl.⁵ .............. H01L 29/00; H01L 29/74; H01L 29/747; H01L 23/02
[52] U.S. Cl. .................. 357/37; 357/74; 357/79; 357/38; 357/39
[58] Field of Search ............. 357/38, 39, 37, 74, 357/79, 77, 75, 76

[56] References Cited

U.S. PATENT DOCUMENTS 4,752,818 6/1988 Kushida et al. ............... 357/38

FOREIGN PATENT DOCUMENTS 0098175 1/1984 European Pat. Off. .
0327316 8/1989 European Pat. Off. .
58-71658 4/1983 Japan .
0169972 10/1983 Japan .................... 357/38
1124176 8/1968 United Kingdom .

OTHER PUBLICATIONS

Patent Abstract of Japan, vol. 8, No. 4, (E-220) [1441] Jan. 10, 1984.

Primary Examiner—Rolf Hille
Assistant Examiner—Wael Fahmy
Attorney, Agent, or Firm—Finnegan, Henderson, Farabow, Garrett and Dunner

[57] ABSTRACT

A crimp-type semiconductor device is provided with a semiconductor substrate having a lifetime-controlled region. This lifetime-controlled region is in the form of a ring, and the lifetime of the minority carriers is shortened in the region. Second-conductivity type impurity regions, which serve as emitter layers, are formed on the semiconductor substrate such that they provide a plurality of concentric arrays. The inner diameter of the ring-like lifetime-controlled region is longer than the diameter of an enveloping circle which is obtained by connecting the radially-inner ends of the impurity regions of the outermost array.

6 Claims, 4 Drawing Sheets

CRIMP-TYPE POWER SEMICONDUCTOR DEVICE

BACKGROUND OF THE INVENTION

1. Field of the Invention

The present invention relates to a crimp-type power semiconductor device having an alloy-free structure wherein a semiconductor substrate and an electrode member are not soldered and which is suitable for use as a gate turn-off (GTO) thyristor, a reverse-blocking triode-thyristor (SCR) or a power transistor.

2. Description of the Related Art

A crimp-type semiconductor device, such as a gate turn-off thyristor (hereinafter referred to as a GTO thyristor), a reverse-blocking triode-thyristor (SCR) or a power transistor, is in general use as a power element. Such a semiconductor device will be explained with reference to FIGS. 1 and 2, taking an anode-shorted GTO thyristor by way of example In the descriptions below, the p- and n-conductivity types will be referred to as the first and second conductivity types, respectively.

Referring to FIG. 1, a disk-shaped, silicon semiconductor substrate 1 is prepared by alternately stacking semiconductor layers of different conductivity types one upon another. Specifically, the semiconductor substrate 1 is made up of first-conductivity type emitter layers 1a, a second-conductivity type base layer 1b, a first-conductivity type base layer 1c and second-conductivity type emitter layers 1d, and these semiconductor layers 1a-1d are arranged in the order mentioned from the side of the first major surface 2 (i.e., the bottom side) to the side of the second major surface 3 (i.e., the top side). The first major surface 2 serves as an anode region of a semiconductor element which is to be formed on the semiconductor substrate 1. In the plane of the first major surface 2, the first-conductivity type emitter layers 1a and the second-conductivity type base layer 1b are exposed, thereby providing a short-circuited structure. The second-conductivity type emitter layers 1d are projected upward from the second major surface 3, thereby providing a so-called mesa structure.

As is shown in FIG. 1, a second main electrode 4 is formed on top of each second-conductivity type emitter layer 1d. A control electrode 5 (i.e., a gate electrode) is formed on those surface portions of the first-conductivity type base layer 1c which are located between adjacent ones of the second-conductivity type emitter layers 1d.

A first main electrode 6, made of e.g. aluminum, is formed on the first major surface 2 of the semiconductor substrate 1, thereby providing a so-called anode-shorted structure.

As is shown in FIG. 1, a second electrode member 7E is arranged with reference to the second main electrodes 4 in an alloy-free state. Likewise, a first electrode member 8 is arranged with reference to the first main electrode 6 in an alloy-free state. The second electrode member 7E is made up of a temperature compensation plate 9 (i.e., a buffer plate against heat) and a soft-metal thin plate 10. The temperature compensation plate 9 is formed of high-melting point metal whose coefficient of thermal expansion is nearly equal to that of Si. For example, it is formed of W or Mo. The soft-metal thin plate 10 is formed of soft metal, such as Al, Ag, or Cu. The temperature compensation plate 9 and the soft-metal thin plate 10 are in contact with each other, and the soft-metal thin plate 10 is in contact with the second main electrodes 4. Incidentally, the soft-metal thin plate 10 need not be a single-layer structure; it may be a laminated structure made up of a plurality of foils.

The first electrode member 8 is formed of high-melting point metal whose coefficient of thermal expansion is nearly equal to that of Si. For example, it is formed of W or Mo. It is kept in contact with the first main electrode 6. A first electrode post 11 and a second electrode post 12, each of which is formed of Cu, are laid over the first electrode member 8 and the temperature compensation plate 9, respectively, such that the semiconductor substrate 1 is held in a strongly-pressed state. In FIG. 1, the first and second electrode posts 11 and 12 are depicted as having diameters substantially equal to those of the temperature compensation plates 8 and 9. In general, however, the diameters of the first and second electrode posts 11 and 12 are determined such that they are equal to, or shorter than the diameter of the semiconductor substrate 1.

In order to make the strongly-pressed state of the substrate 1 satisfactory, the second electrode member 7E is made up of two plates (namely, the temperature compensation plate 9 and the soft-metal thin plate 10), as mentioned above. In addition, the second electrode post 11 is made to have a different shape from that of the first electrode post 11, such that a spring member 13 and a gate lead section 14 (both of which will be mentioned later) can be provided.

As is apparent from FIG. 1, the second electrode post 12 has a step section which is formed by partly cutting out the post 12 from the center to the periphery. An insulating member 15 is located at that position of the step section which corresponds to the control electrode 5. A positioning guide 16 is located at both ends of the insulating member 15. At one end of the gate lead section 14, a conductive member 17 whose size is determined in accordance with the shape of the control electrode 5 is located. The conductive member 17 has a short-diameter straight portion 18 which linearly extending upward, and an extension portion 19 which is bent at right angels to the straight portion 18 and which extends to the outside of the device through an envelope 19-B (which is formed of ceramics or the like). At the other end of the gate lead section 14, a metallic sleeve 19-A soldered to the envelope 19-B is provided. Through this metallic sleeve 19-B, the gate lead section 14 is led to an external region. In order for the semiconductor substrate 1 (which is sandwiched between the second electrode member 7E and the first electrode member 8) to be pressed with a predetermined pressure, the spring member 13 is attached to the insulating member 15. A coil spring, a disk spring, or the like is used as the spring member 13.

The side faces of the semiconductor substrate 1 are beveled. After being subjected to etching treatment, the beveled surfaces are covered with silicone resin 19-C, for encapsulation. Finally, the flanges of the first and second electrode posts 11 and 12 are coupled to the envelope 19-B by soldering, thereby completing the fabrication of the anode-shorted GTO thyristor.

FIG. 2A is a partial plan view of the second major surface 3 of the semiconductor substrate 1, and conceptually illustrates the positional relationships between the second main electrodes 4 (indicated with solid lines) and the second electrode post 12 (indicated with broken lines). As can be seen from FIG. 2A, the second main electrodes 4 are formed on the respective second-conductivity type emitter layers 1d which are radially arranged on the first-conductivity type base layer 1c.

FIG. 2B illustrates a case where the second main electrodes 4 are arranged in parallel to one another. Like FIG. 2A, FIG. 2B is a partial plan view of the second major surface 3 of the semiconductor substrate and conceptually illustrates the positional relationships between the second main electrodes 4 (indicated with solid lines) and the second electrode post 12 (indicated with broken lines). Incidentally, reference symbol x indicates those portions of the second main electrodes 4 which are out of the range of the second electrode post 12.

As is shown in FIG. 1, the second electrode post 12 is provided with a cutaway section 12A. This cutaway section 12A is formed at a predetermined slanting angle at the periphery of the surface which is in contact with the second electrode member 7E. When the second electrode post 2 is strongly pressed against the second main electrodes 4, with the second electrode member 7E interposed, the cutaway section 12A prevents largely-different forces from being exerted to the end portion of the second main electrodes 4.

In the GTO thyristor shown in FIG. 1, the second electrode post 12 does not have a satisfactory heat-radiating characteristic at those portions which are not pressed, with the second electrode member 7E interposed, against the second main electrodes 4, i.e., at the portions indicated by reference symbol x in FIGS. 2A and 2B.

In addition, in the case where the second electrode post 12 and the second main electrodes 4 are arranged and positioned in the manner illustrated in FIGS. 2A and 2B, a current flow occurs concentratedly at the ends of the regions on which a strong force is exerted. As a result, the ability to withstand a surging current, an excessive amount of turn-off current, etc. deteriorates.

More specifically, the second main electrodes 4 are partly pressed by the second electrode post 12. In other words, the second main electrodes 4 include those portions which are not pressed by the second electrode post 12. Due to the existence of such portions, the current produced inside the semiconductor substrate 1 flows concentratedly into the end portions of the second electrode post 12, increasing the electric resistance of the end portions. Further, the heat generated in the semiconductor substrate 1 is transmitted to the end portions of the second electrode post 12. As a result, the thermal resistance of the region Y indicated in FIG. 1 increases, resulting in insufficient heat radiation.

As may be understood from the above, heat is generated concentratedly in the region Y when the GTO thyristor is turned off. Thus, it may happen that the GTO thyristor will be damaged due to the generation of such a hot spot in the semiconductor substrate 1.

SUMMARY OF THE INVENTION

Accordingly, an object of the present invention is to provide a crimp-type semiconductor device of an alloy-free structure, wherein a semiconductor substrate is held in a uniformly-pressed state, and wherein thermal destruction at a turn-off time is prevented, with the heat generation being suppressed in regions where the heat-radiating characteristics are not very good.

According to an aspect of the invention, there is provided a crimp-type semiconductor device, which comprises: a disk-shaped semiconductor substrate made up of semiconductor layers of first and second conductivity types and having first and second major surfaces; a plurality of first-conductivity type impurity regions formed in the second-conductivity type semiconductor layer of the semiconductor substrate and exposed in the first major surface of the semiconductor substrate; a plurality of substantially rectangular second-conductivity type impurity regions radially arranged on the first-conductivity type semiconductor layer of the semiconductor substrate, the second conductivity type impurity regions being arranged to provide a plurality of concentric arrays and being projected from the second major surface of the semiconductor substrate; a first main electrode which is in contact with the first-conductivity type semiconductor layer; a plurality of second main electrodes which are in contact with the second-conductivity type impurity regions; a first electrode member which is in contact with the first main electrode; a second electrode member which is in contact with the second main electrodes; a first electrode post for pressing the first electrode member against the semiconductor substrate, the first electrode post being in contact with the first electrode member and having a cutaway section formed at the periphery of an upper surface thereof; a second electrode post for pressing the second electrode member against the semiconductor substrate, the second electrode post being in contact with the second electrode member and having a cutaway section formed at the periphery of a lower surface thereof, wherein the disk-shaped semiconductor substrate is provided with an annular region having a shorter lifetime than that of other regions, the annular region having an inner diameter which is longer than the diameter of an enveloping circle obtained by connecting radially-inner ends of the second-conductivity type impurity regions of the outermost array, and which is equal to, or shorter than the diameter of a circle corresponding to the lower end of the cutaway section of the second electrode post.

The above crimp-type power semiconductor device is of an alloy-free structure wherein the semiconductor substrate and the electrode members are in direct contact with each other, with no soldering material interposed. The outer diameter of the second electrode member is longer than that of the arranging pattern of the second main electrodes, while the inner diameter of the second electrode member is shorter than that of the arranging pattern of the second main electrodes. The outer diameter of the first electrode member is longer than that of the first main electrode, so that the first electrode member covers the entire surface of the first main electrode.

The outer diameter of the first electrode post is shorter than that of the first electrode member, and the outer diameter of the second electrode post is shorter than that of the second electrode member. Therefore, the first and second electrode posts pres each portion of the first and second electrode member with a uniform pressure. In general, it is considered that in a substantially flat crimp-type semiconductor device, the path of the main current and the path of the heat generated in the semiconductor substrate are substantially the same. In the present invention, therefore, each of the semiconductor layers of the substrates is such that the region through which the main current flows in the semiconductor device is covered with the electrode members. With this structure, the density of the main current flowing through the substrate does not differ greatly from the density of the main current flowing through the main electrodes.

Moreover, the semiconductor substrate is provided with a short-lifetime segment located in regions where the heat-radiating characteristic is not good. Since such a segment is comparatively hard to operate, the ability to withstand turn-off operations is improved, without the turn-off characteristics being degraded.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

These and other features and advantages of the present invention will become more apparent from the following detailed descriptions of exemplary embodiment as illustrated in the accompanying drawings, in which.

DETAILED DESCRIPTION OF THE PREFERRED EMBODIMENTS

A crimp-type semiconductor device of the preferred embodiments of the present invention will be described with reference to the accompanying drawings, referring to the case where it is embodied as an anode-shorted type GTO thyristor having an alloy-free structure.

Figure 1:
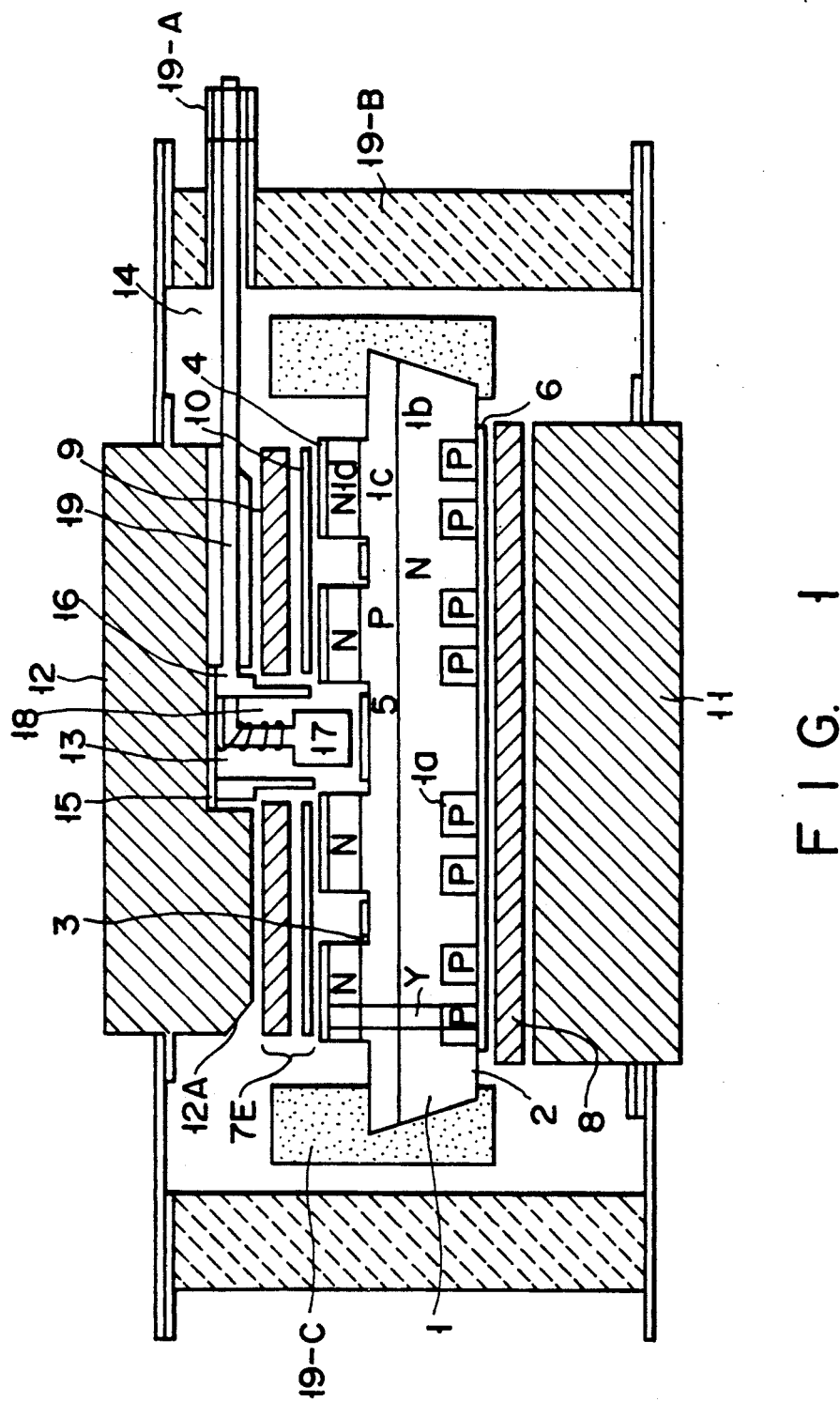
FIG. 1 is a schematic sectional view of a GTO thyristor which is an example of a conventional crimp-type semiconductor device.
Figure 2B:
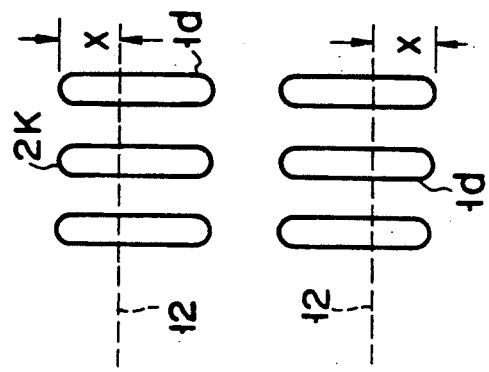
FIGS. 2A and 2B conceptually illustrate the two positional relationships between the second-conductivity type emitter layers and second electrode post of the GTO thyristor shown in FIG. 1.
Figure 2A:
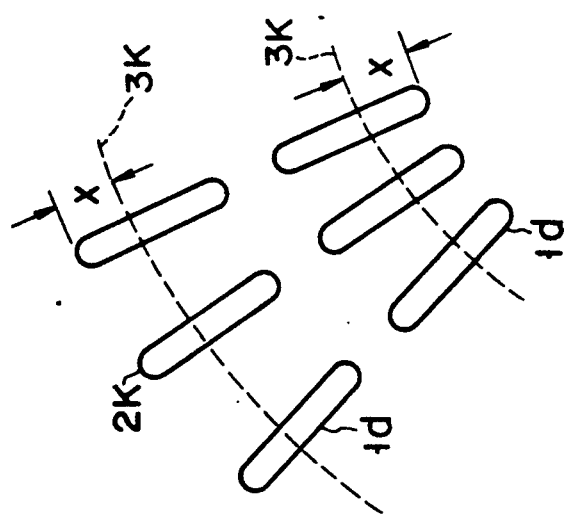
Figure 3:
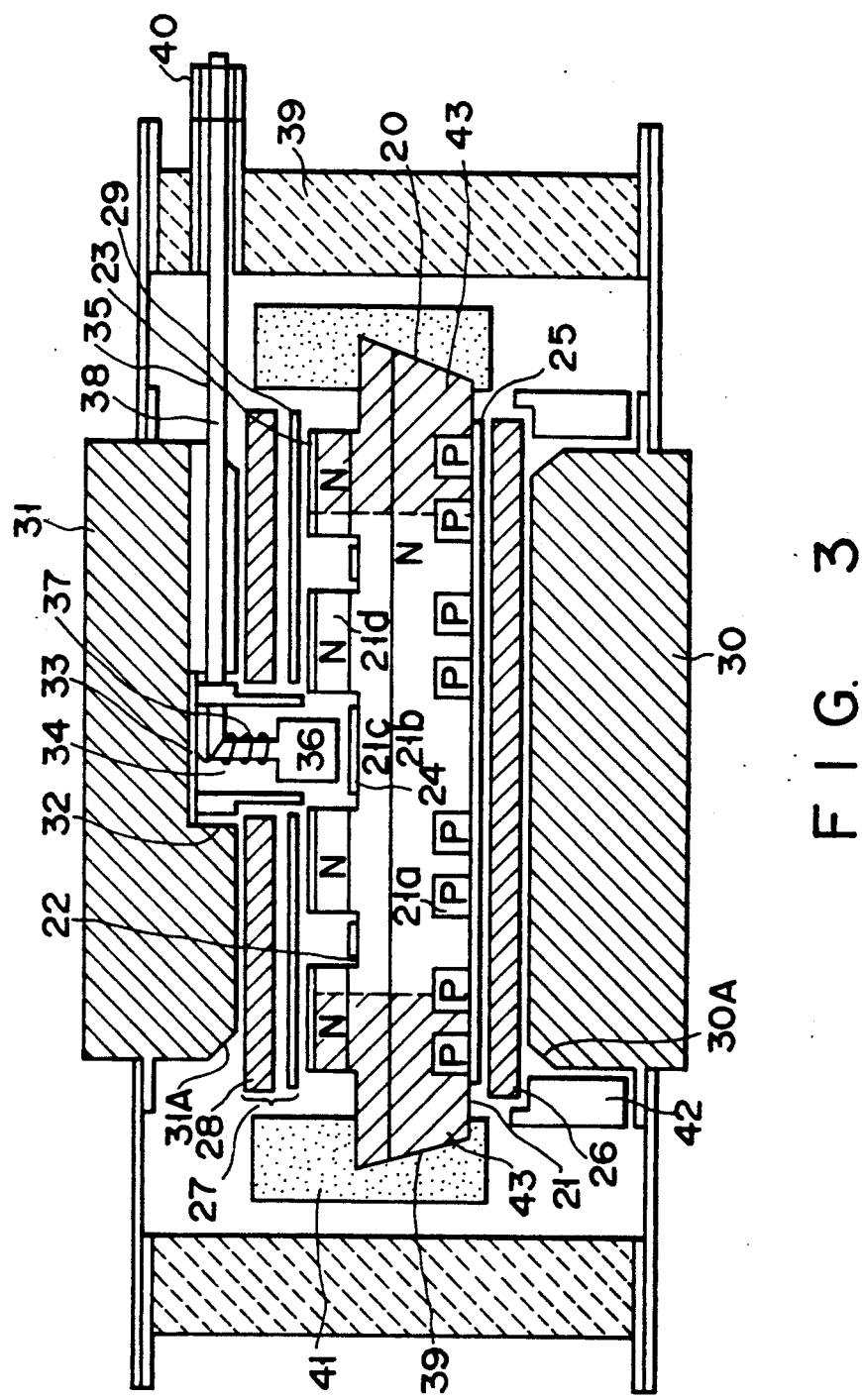
FIG. 3 is a schematic sectional view of a GTO thyristor which is an example of a crimp-type semiconductor device according to the present invention.

FIG. 3 is a sectional view of the GTO thyristor embodying the present invention. Referring to FIG. 3, a disk-shaped silicon semiconductor substrate 20 is made up of first and second semiconductor layers which are of the first and second conductivity types, respectively, and which are stacked upon each other. These semiconductor layers serve as base layers 21b and 21c, respectively. A plurality of first-conductivity type impurity regions are in the base layer 21b such that their surfaces are exposed. A plurality of second-conductivity type impurity regions are on the base 21c such that they are projected from the surface of the base layer 21c. The first- and second-conductivity type impurity regions serve as emitter layers 21a and 21d of the GTO thyristor, respectively. The emitter layers 21d each have a substantially rectangular shape, and are radially arranged on the disk-shaped semiconductor substrate 20 around the center of the substrate 20.

The upper side of the semiconductor substrate 20 will be referred to as the second major surface 22 herein, and this major surface 22 is constituted by the surface of the first-conductivity type base layer 21c. The second-conductivity type emitter layers 21d serve as a cathode region, and a second main electrode 23 is on each of the emitter layers 21d. The first-conductivity type base layer 21c serves as a base region, and a control electrode 24 is on the base layer 21d. The lower side of the semiconductor substrate 20 will be referred to as the first major surface 21 herein, and the first-conductivity type emitter layers 21a and the second-conductivity type base layer 21b are exposed in the first major surface 21. A first main electrode 25 is formed on the first major surface 21, such that the emitter layers 21a and the base layer 21b are short-circuited to each other.

The second-conductivity type emitter layers 21d are formed by doping second-conductivity type impurities, such as phosphorus, into selected portions of the first-conductivity type base layer 21c by either ion implantation or diffusion. After the impurities are diffused in the base layer 21c, the impurity-diffused regions are selectively removed by isotropic or anisotropic etching.

Figure 4:
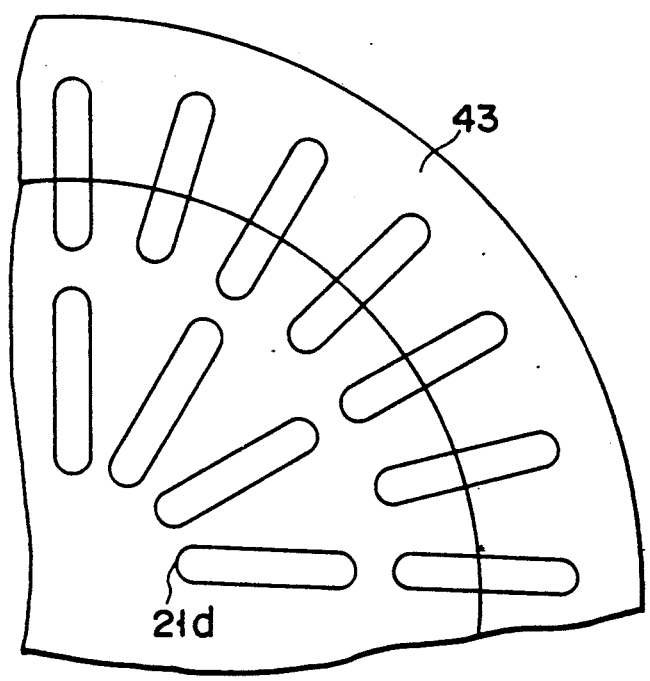
FIG. 4 conceptually illustrates the positional relationships between the second-conductivity type emitter layers and electron beam-irradiated section of the GTO thyristor shown in FIG. 3.

As is shown in FIG. 4, the second-conductivity emitter layers 21d are each in the form of an elongated segment, and are radially arranged on the base layer 21c in such a manner that they provide a plurality of concentric arrays. The emitter layers 21d are projected from the base layer 21c. If viewed from above, the emitter layers 21d look like a plurality of rings arranged around the control electrode 24. It should be noted that the emitter layers 21d need not be arranged in a radial pattern; they may be arranged in parallel to one another, if so desired.

The semiconductor substrate 2 is provided with lifetime-different regions on selected portions thereof. The lifetime of the regions is controlled such that the ability to withstand turn-off operations, particularly turn-off operations at high frequencies, can be improved, without causing adverse effects on the gate sensitivity, the ON voltage, the turn-off characteristic and other characteristics. In general, the lifetime control is carried out by the diffusion of heavy metal (e.g., gold or platinum), the irradiation of a radiation (e.g., an electron beam), or both of these in combination. In the preferred embodiments of the present invention, the lifetime of the regions in question is controlled to be within the range of 10 to 35 $\mu$m or so, by the diffusion of gold or platinum and by the irradiation of an electron beam.

The entire semiconductor substrate may be irradiated with electron beams or protons. In this case, a larger amount of electron beams or protons are irradiated toward that region of the semiconductor substrate 20 which indicated by the oblique lines in FIG. 4, so that the lifetime of the minority carriers in that region is shorter than the lifetime of the minority carriers in the other regions. The shorter-lifetime region corresponds in location to the lifetime-controlled region 43 mentioned above, and its inner diameter is equal to that of the lifetime-controlled region 43.

Next, a description will be given as to how the crimp-type semiconductor device incorporating the above-described semiconductor substrate is assembled. A first electrode member 26 is arranged with reference to the first main electrode 25, and a second electrode member 27 is arranged with reference to both the second main electrode 23 and the control electrode 24. The first electrode member 26 is of high-melting point metal, such as W or Mo, and serves as a temperature compensation plate (i.e., a buffer plate against heat). The second electrode member 27 is made up of: a temperature compensation plate 28 formed of the same material as the first electrode member 26; and a soft-metal thin plate 29. The soft-metal thin plate 29 is a plate formed of Ag, Al or Cu. Alternatively, it may be a laminated structure wherein foils of at least one of Ag, Al and Cu are stacked upon one another. The outer periphery of the first electrode member 26 is outwardly projected from the outer periphery of the first main electrode 25, and the outer periphery of the second electrode member 27 is outwardly projected from the radially-outer ends of the second main electrodes 23 constituting the outermost array. First and second electrode posts 30 and 31 are stacked on the first and second electrode members 26 and 27, respectively, to thereby obtain a crimp-type structure. The first and second electrode posts 30 and 31 have outer diameters which are shorter than those of the first and second electrode members 26 and 27, respectively, and inner diameters which are longer than those of the first and second electrode members 26 and 27, respectively. Cutaway sections 30A and 31A are formed at the outer peripheries of the upper and lower surfaces of the first and second electrode posts 30 and 31, respectively. The second electrode post 31 has a groove section 32 which is formed by partly cutting out the post 31 from the center to the periphery, and members for pressing the semiconductor substrate and a gate lead 35 are arranged inside the groove section 32. In order to electrically insulate the second electrode post 31 and the control electrode 24, an insulating material 33 is arranged on the groove section 32 of the second electrode post 31. A conductive member 36 is located at one end of the gate lead 35, and a spring member is provided for the conductive member 36. Since the conductive member 36 is pressed against the control electrode 24 by the expanding force of the spring member, the second electrode post 31 is pressed against the semiconductor substrate 20, accordingly.

The gate lead 35 is electrically connected to the control electrode 24, and the conductive member 36 located at one end of the gate lead 35 is provided with a short-diameter straight portion 37 and an extension portion 38. The straight portion 37 is continuous to the conductive member 36, and the extension portion 38 is bent with reference to the straight portion 37 and is connected to a point outside of the element. The crimp-type power GTO element is received in a ceramic tubular envelope 39, and flanges attached to the first and second electrode posts 30 and 31 are soldered to the tubular envelope 39. As is shown in FIG. 3, the extension portion 38 of the gate lead 35 is covered with a metallic sleeve 40 which is inserted into and fixed to the tubular envelope 39. In order to maintain the breakdown voltage of the element at a predetermined value, the side faces of the semiconductor substrate 20 are beveled, subjected to etching treatment, and then covered with silicone resin 41 or the like, for encapsulation. In this manner, the pn junctions exposed by beveling the side faces of the semiconductor substrate 20 are protected.

A positioning guide 42 is used for positioning the main electrodes, the electrode members and the electrode posts with reference to one another. Specifically, the semiconductor substrate 20 is positioned with reference to the first and second electrode members 26 and 27 by utilizing the silicon resin coated on the side faces of the semiconductor substrate 20. The second electrode member 27 and the second electrode post 31 are positioned with reference to each other by utilizing the positioning guide 42. This positioning guide 42 can also be used for positioning the gate lead 35. The positioning guide 42 is formed of an insulating material, such as Teflon (trademark) or epoxy resin, and is an annular member having a step section on the upper face thereof. The outer peripheral face of the upper portion of the positioning guide 42 has an outer diameter equal to the hollow section of the second electrode post, and the outer peripheral face of the lower portion thereof has an outer diameter equal to the hollow section of the second electrode member 27.

After the beveling and encapsulation steps which are carried out prior to the assembly of the gate lead 35, the lifetime of the minority-carrier portions of the semiconductor substrate 20 is decreased to approximately to half (i.e., 5 μm to 20 μm)) by the irradiation of electron beams and protons. As is shown in FIG. 4, the lifetime-controlled region 43 is controlled is in the form of a ring. The inner diameter of this lifetime-controlled region 43 is longer than the diameter of an enveloping circle obtained by connecting the radially-inner ends of the emitter layers 21d of the outermost array. Further, the inner diameter of the lifetime-controlled region 43 is shorter than the diameter of the circle along which the lower end of the cutaway section 31A of the second electrode post 31 is in contact with the second electrode member 27. Preferably, the inner diameter of the lifetime-controlled region 23 is larger than the value obtained by subtracting the value corresponding to the thickness of the second electrode member 27 from the value corresponding to the diameter along which the lower end of the cutaway section 31A of the second electrode post 31 is in contact with the second electrode member 27.

The GTO thyristor of the present invention has a breakdown voltage in the range of 2,500 to 4,500 V, and the first-conductivity type base layer 21c initially has a specific resistance in the range of 100 to 250 Ω·cm. To obtain a lifetime of 5 to 20 μs, the irradiation of electron beams and protons is carried out, with an electrode beam intensity of 5 to 15 MeV and with a dose of $5 \times 10^{11}$ to $5 \times 10^{12}$ 1 cm².

During the above irradiation, those regions of the semiconductor substrate 20 other than the lifetime-controlled region 43 are covered with a shield plate having a thickness of 5 to 10 mm and formed of tungsten or molybdenum. In other words, the irradiation of electron beams or protons is carried out with respect to the semiconductor substrate portions whose heat-radiating characteristic is not good. The amount of electron beams or protons which are irradiated onto such substrate portions ranges from the value approximately equal to the amount which is irradiated over the entire semiconductor substrate to the value which is twice as large as that amount.

As a result of the above irradiation, a crimp-type power GTO thyristor is obtained, wherein the lifetime of its lifetime-controlled region 43 (i.e., the outermost segments of the substrate 20) is about ¼ to ¾ of the lifetime of the other segments of the substrate 20.

As mentioned above, the lifetime of part of the semiconductor substrate is reduced to a value within the predetermined range. As a result of the reduced lifetime, the ability to withstand turn-off operations at high frequencies is improved from 2,700A (the value of the conventional device) to 3,300A or more (the value of the present invention), without the gate sensitivity ($I_{GT}$, $V_{GT}$, etc.), the constant ON characteristic ($V_{TM}$), the turn-off characteristic ($t_d$, $t_{gt}$) being degraded. The device may break down if the current exceeds 3,300A. Even if this breakdown occurs, its location is not a peripheral portion of the device but a portion which is within the range of the electrode posts. Therefore, such a breakdown is not due to a poor heat-radiating characteristic of the device, but results from the original characteristic of the silicon semiconductor substrate.

If the lifetime-reduced region is too narrow or if the lifetime of this region is not reduced very much, the ability to withstand the turn-off operations remains unimproved. In such a case, breakdown may occur in a peripheral portion of the device, as in the prior art. Conversely, if the lifetime-reduced region is too wide or if the lifetime of this region is reduced too much, the gate sensitivity, the constant ON characteristic and the turn-off characteristic are degraded though the ability to withstand turn-off operations can be improved. In the present invention, therefore, the lifetime is controlled such that the segments located in the region where the heat-radiating characteristic is poor become comparatively hard to operate. By controlling the lifetime in this manner, the ability to withstand turn-off operations can be improved, without causing adverse effects on the other characteristics.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A crimp-type semiconductor device comprising:
    a disk-shaped semiconductor substrate including first and second major surfaces, a first semiconductor layer of a first conductivity type, and a second semiconductor layer of a second conductivity type;
    a plurality of first-conductivity type impurity regions in the second layer and exposed in the first major surface;
    a plurality of substantially rectangular second-conductivity type impurity regions radially arranged on the first layer, said second conductivity type impurity regions being arranged as a plurality of arrays, the plurality of arrays being concentric relative to each other around a center, the plurality of arrays including an outermost array;
    a first main electrode in contact with the second layer;
    a plurality of second main electrodes in contact with the respective second-conductivity type impurity regions;
    a first electrode member in contact with the first main electrode;
    a second electrode member in contact with the second main electrodes;
    a first electrode post for pressing the first electrode member against the semiconductor substrate, said first electrode post being in contact with the first electrode member and having a cutaway section at the periphery of an upper surface thereof;
    a second electrode post for pressing the second electrode member against the semiconductor substrate, said second electrode post having a portion contacting the second electrode member and having a cutaway section at the periphery of a lower surface thereof,
    wherein said disk-shaped semiconductor substrate is provided with an annular lifetime-controlled region having an inner diameter, the inner diameter being sufficiently large such that the inner diameter is farther from the center than at least part of each of the second conductivity type impurity regions of the outermost array, and being sufficiently small such that the inner diameter is in vertical alignment with the contacting portion.

2. The crimp-type semiconductor device according to claim 1 wherein the second electrode member has a thickness of a first value, the contacting portion has a periphery, and the inner diameter is laterally removed from the periphery by no more than the first value.

3. The crimp-type semiconductor device according to claim 1, wherein the lifetime of the lifetime-controlled region is within the range 0.25 to 0.75 of a lifetime of other portions of the substrate.

4. A crimp-type semiconductor device comprising:
    a disk-shaped semiconductor substrate including first and second major surfaces, a first semiconductor layer of a first conductivity type, and a second semiconductor layer of a second conductivity type;
    a plurality of first-conductivity type impurity regions in the second layer and exposed in the first major surface;
    a plurality of substantially rectangular second-conductivity type impurity regions radially arranged on the first layer, said second conductivity type impurity regions being arranged as a plurality of arrays, the plurality of arrays being concentric relative to each other around a center;
    a first main electrode which is in contact with the second layer;
    a plurality of second main electrodes in contact with the respective second-conductivity type impurity regions;
    a first electrode member in contact with the first main electrode;
    a second electrode member in contact with the second main electrode;
    a first electrode post for pressing the first electrode member against the semiconductor substrate, said first electrode post being in contact with the first electrode member and having a cutaway section at the periphery of an upper surface thereof;
    a second electrode post for pressing the second electrode member against the semiconductor substrate, said second electrode post having a portion contacting the second electrode member and having a cutaway section at the periphery of a lower surface thereof,
    wherein said disk-shaped semiconductor substrate is provided with a shorter-lifetime region and a longer lifetime region which are concentric with each other, and said shorter-lifetime region surrounds the longer lifetime region and has an inner diameter, the inner diameter being sufficiently large such that the inner diameter is farther from the center than at least part of each of the second conductivity type impurity regions of the outermost array, and being sufficiently small such that the inner diameter is in vertical alignment with the contacting portion.

5. The crimp-type semiconductor device according to claim 4 wherein the second electrode member has a thickness of a first value, the contacting portion has a periphery, and the inner diameter is laterally removed from the periphery by no more than the first value.

6. The crimp-type semiconductor device according to claim 4, wherein the lifetime of the lifetime-controlled region is within the range of 0.25 to 0.75 of a lifetime of other portions of the substrate.

* * * * *